US007539953B1

United States Patent
Seng et al.

(10) Patent No.: US 7,539,953 B1
(45) Date of Patent: May 26, 2009

(54) METHOD AND APPARATUS FOR INTERFACING INSTRUCTION PROCESSORS AND LOGIC IN AN ELECTRONIC CIRCUIT MODELING SYSTEM

(75) Inventors: Shay Ping Seng, San Jose, CA (US); Jonathan B. Ballagh, Boulder, CO (US); Roger B. Milne, Boulder, CO (US); Bradley L. Taylor, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 217 days.

(21) Appl. No.: 11/633,977

(22) Filed: Dec. 5, 2006

(51) Int. Cl.
*G06F 17/50* (2006.01)
(52) U.S. Cl. .................. 716/1; 716/3; 716/17
(58) Field of Classification Search .......... 716/1, 716/3, 17
See application file for complete search history.

(56) References Cited

U.S. PATENT DOCUMENTS

| | | | | |
|---|---|---|---|---|
| 6,634,017 B2 * | 10/2003 | Matsui et al. | ......... | 716/11 |
| 6,823,498 B2 * | 11/2004 | Downer et al. | ......... | 716/7 |
| 7,310,594 B1 * | 12/2007 | Ganesan et al. | ......... | 703/13 |
| 7,340,692 B2 * | 3/2008 | Matsui et al. | ......... | 716/1 |
| 7,373,432 B2 * | 5/2008 | Rapp et al. | ......... | 710/8 |
| 2003/0131330 A1 * | 7/2003 | Downer et al. | ......... | 716/7 |
| 2006/0031791 A1 * | 2/2006 | Moona et al. | ......... | 716/3 |
| 2007/0136698 A1 * | 6/2007 | Trujillo et al. | ......... | 716/1 |

* cited by examiner

*Primary Examiner*—Stacy A Whitmore
*Assistant Examiner*—Magid Y Dimyan
(74) *Attorney, Agent, or Firm*—Robert M. Brush

(57) ABSTRACT

Method, apparatus, and computer readable medium for circuit design is described. In one example, a model having at least one processor, at least one logic, and at least one shared memory is specified. The at least one shared memory is associated with the at least one processor. A memory map associated with the at least one shared memory and a bus adapter for coupling the memory map to the at least one processor are automatically generated.

20 Claims, 4 Drawing Sheets

100

METHOD AND APPARATUS FOR INTERFACING INSTRUCTION PROCESSORS AND LOGIC IN AN ELECTRONIC CIRCUIT MODELING SYSTEM

FIELD OF THE INVENTION

One or more aspects of the present invention relate generally to electronic design and modeling systems for electronic circuits and, more particularly, to a method and apparatus for interfacing instruction processors and logic in an electronic circuit modeling system.

BACKGROUND OF THE INVENTION

Electronic design automation (EDA) systems provide software tools in which electronic circuit designs can be described, simulated, and translated by machine into a design realization. A conventional mechanism for describing a circuit design is hardware description language (HDL). A user defines a behavioral description of a design using HDL and the HDL design is processed to generate a physical implementation. HDL design tools include HDL simulation environments, such as the ModelSim environment from the Model Technology Company, and implementation environments, such as Synplify from Synplicity, Inc. Another type of circuit design system, referred to as a high level modeling system (HLMS), provides a higher level of abstraction for describing and simulating an electronic circuit than does an HDL simulation environment or implementation environment. An HLMS generally provides a mathematical representation of signals as compared to standard logic vectors in an HDL. It is desirable for the high-level abstractions to be precisely correlated with the ultimate implementation representation, both in simulation semantics and in implementation. The Xilinx System Generator tool for DSP and the MathWorks' Simulink and MATLAB environments are example HLMS's in which such capabilities are desirable.

Conventionally, HLMS's have often been used to specify systems that are easily expressed as data flow diagrams (e.g., digital filters). As HLMS's mature, designers are seeking to incorporate larger systems into an HLMS design, such as video-processing engines (e.g., MPEG encoders and decoders) and system-on-chip (SoC) designs, for example. Such designs may include instances of embedded instruction processors. In both HLMS and HDL environments alike, some type of communication protocol and connection medium must be used to interface a custom data processor with an instruction processor. For local connections, some form of a bus structure is typically employed to provide an interface between the custom data processor and the instruction processor. For non-local connections, a packet-based mechanism may be used, such as transmission control protocol/internet protocol (TCP/IP).

Interfacing custom logic blocks (e.g., a custom data processor) with instruction processors is tedious, error prone, and requires in-depth knowledge of traditional hardware design flow, instruction processor architectures, and traditional software design methodologies. The barrier to using instruction processors is further exacerbated by the plethora of instruction processor types and buses a designer may choose. The root of the problem is that custom logic blocks tend to be data-bound and, by that nature, predominately process data. Instruction processors predominately process instructions and, as such, require significantly more control logic and signals. Interfacing these two kinds of processors requires hardware interfaces and software drivers to bridge the hardware-software divide, and the creation of these interfaces and drivers is often difficult. Further, when a designer has designed hardware that is attached to a bus architecture, that logic is now tied to that specific architecture. Porting the design to operate with another bus architecture is at best tedious, and often arduous.

Accordingly, there exists a need in the art for a method and apparatus for interfacing instruction processors and user logic in an electronic circuit modeling system.

SUMMARY OF THE INVENTION

Method, apparatus, and computer readable medium for circuit design is described. In one embodiment, a model having at least one processor, user logic, and at least one shared memory is specified. The at least one shared memory is associated with the at least one processor. A memory map associated with the at least one shared memory and a bus adapter for coupling the memory map to the at least one processor are automatically generated.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
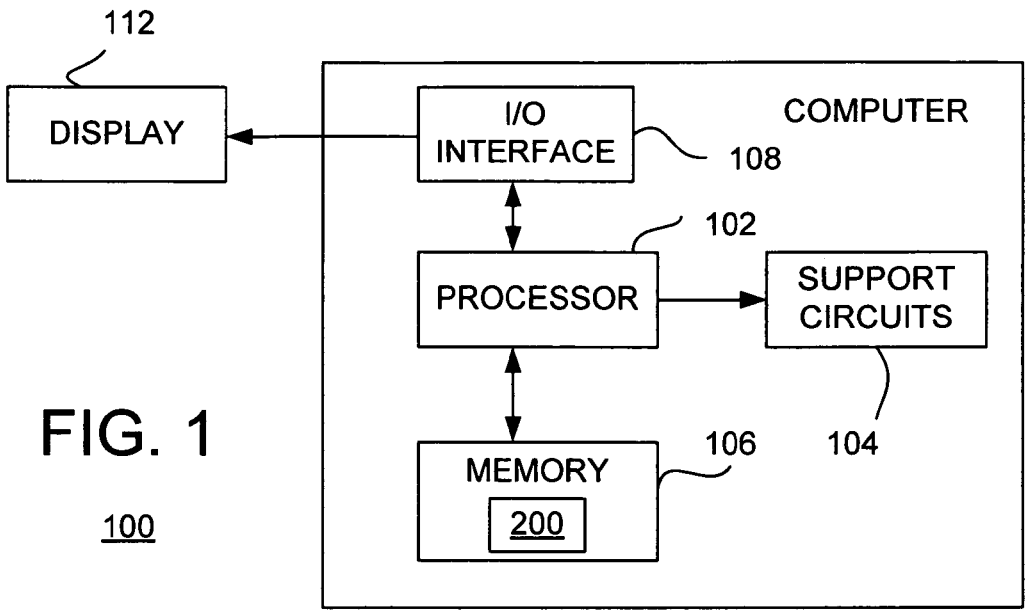
FIG. 1 is a block diagram depicting an exemplary embodiment of a computer system suitable for implementing processes and methods described herein.

FIG. 1 is a block diagram depicting an exemplary embodiment of a computer system 100 suitable for implementing processes and methods described herein. The computer system 100 includes a central processing unit (CPU) 102, a memory 106, a variety of support circuits 104, and an I/O interface 108. The CPU 102 may be any type of microprocessor known in the art. The support circuits 104 for the CPU 102 include conventional cache, power supplies, clock circuits, data registers, I/O interfaces, and the like. The I/O interface 108 may be directly coupled to the memory 106 or coupled through the CPU 102, and may be coupled to a conventional keyboard, network, mouse, printer, and interface circuitry adapted to receive and transmit data, such as data files and the like. The I/O interface 108 may be coupled to a display 112.

The memory 106 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

The computer system 100 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 106. The memory 106 may include one or more of the following random access memory, read only memory, magneto-resistive read/write memory, optical read/write memory, cache memory, magnetic read/write memory, and the like, as well as signal-bearing media as described below. The memory 106 may store all or a portion of integrated circuit modeling system 200 of FIG. 2.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); and (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

Figure 2:
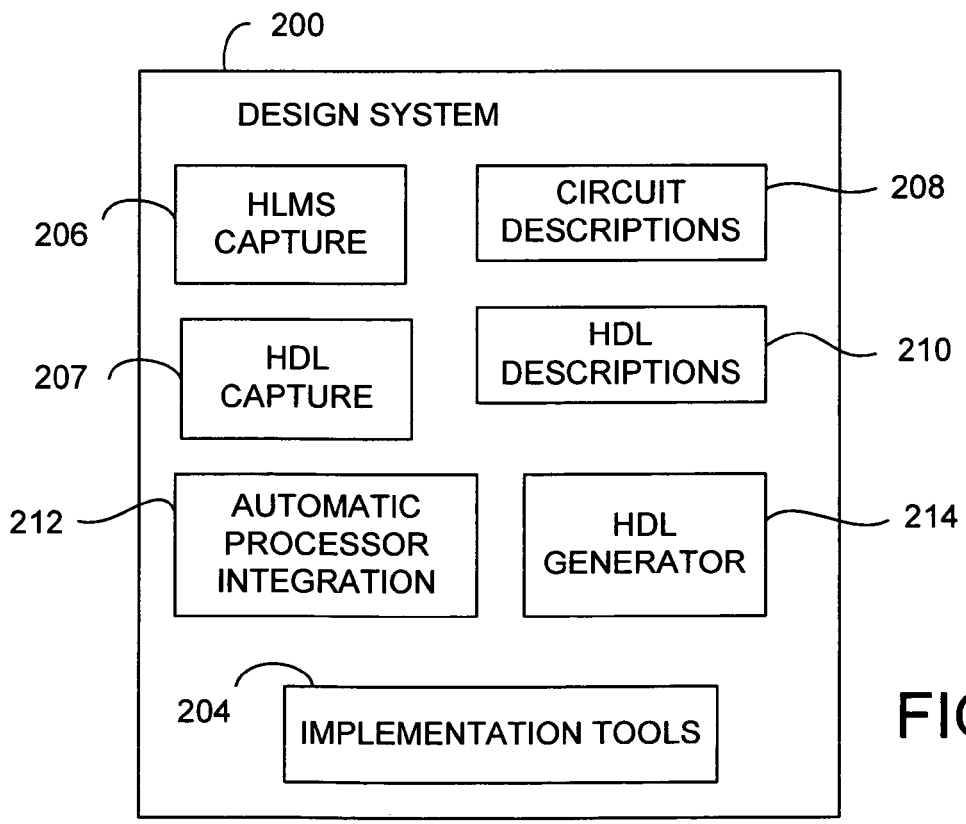
FIG. 2 is a block diagram depicting an exemplary embodiment of an integrated circuit modeling system in accordance with one or more aspects of the invention.

FIG. 2 is a block diagram depicting an exemplary embodiment of an integrated circuit modeling system 200 in accordance with one or more aspects of the invention. The modeling system 200 may provide an HLMS environment, an HDL environment, or both. If an HLMS environment is implemented, the modeling system 200 includes an HLMS capture module 206, an automatic processor integration module 212, an HDL generator module 214, a circuit description library 208, an HDL description library 210, and implementation tools 204. If an HDL environment is implemented, the modeling system 200 includes an HDL capture module 207, the automatic processor integration module 212, the HDL description library 210, and the implementation tools 204. If a combination of an HLMS and HDL environment is implemented, the modeling system 200 includes each of the aforementioned elements. The modeling system 200 may be implemented using the computer system 100 of FIG. 1. Notably, each of the modules 204 through 214 may be all or portions of one or more programs stored within the memory 106 and executed by the CPU 102.

The HLMS capture module 206 is configured to capture an electronic representation or model of a circuit design ("circuit model") in response to schematic or logic level input by a circuit designer. The circuit model may be schematically represented on a graphical user interface (GUI) (e.g., on the display 112 of the computer system 100). In one embodiment, the circuit model is an abstraction of a circuit design that includes "blocks", "ports", and "nets". Blocks, or logic blocks, represent sections, having circuit elements, of the circuit design. Ports represent inputs and outputs of blocks, and nets, or networks, represent connections between various ports of various blocks. The blocks, ports, and nets of the circuit model represent an abstraction of the circuit design in a well-known manner.

For example, blocks, ports, and nets are abstractions that may be produced by System Generator for DSP, commercially available from Xilinx, Inc, or other known abstraction translators. As understood by those skilled in the art, however, circuit design systems may employ other types of abstractions to represent a circuit design in addition to, or in place of, the above-described blocks, ports, and nets. In general, the circuit model produced by the HLMS capture module 206 includes a plurality of circuit descriptions that represent the behavior of circuit elements. Such circuit descriptions may be stored in the circuit description library 208.

The HDL capture module 207 is configured to capture a structural and/or behavioral description of a circuit model using an HDL, such as Very High-Speed Integrated Circuit HDL (VHDL) or VERILOG. The HDL description of the circuit model includes a plurality of circuit components, such as flip-flops, memories, lookup tables, logic gates, and the like, connected together via signal conductors (nets). The HDL capture module 207 may include a graphic interface (e.g., on the display 112 of the computer system 100) through which a designer connects symbols and blocks representing various components to produce a schematic description of the circuit design. Alternatively or in addition to schematic capture, the HDL capture module 207 may include a text interface through which a designer writes HDL code to produce a structural and/or behavioral description of the circuit design in terms of HDL constructs. HDL circuit descriptions may be stored in the HDL description library 210.

The HDL generator 214 is configured to translate a circuit model generated by the HLMS capture module 206 into an HDL representation, such as VHDL, VERILOG, and the like. Circuit descriptions in the HLMS circuit model are translated to produce an HDL description of the circuit model. An HDL description produced by the HDL generator 214 may be combined with an HDL description generated by the HDL capture module 207 to produce the circuit model. Those skilled in the art will appreciate that the circuit model produced by the HMLS capture module 206 can be translated into other types of hardware representations, such as a logical or gate-level netlist.

The HDL representation of the circuit model generated by the HDL generator 214 and/or HDL capture module 207 may be processed by the implementation tools 204 for physically implementing a circuit. For example, in one embodiment, the implementation tools 204 generate a configuration bitstream for configuring a programmable logic device (PLD), such as a field programmable gate array (FPGA) with a circuit. An FPGA is a well-known integrated circuit (IC) capable of implementing user-defined circuits using programmable logic. Implementation tools for an FPGA may include a synthesis tool for producing a logical or gate-level netlist from an HDL description, a map tool for mapping the netlist onto FPGA resources, a place-and-route (PAR) tool for placing the mapped resources and routing connections between them, and a bitstream generator for generating a configuration bitstream. Such FPGA implementation tools are well known in the art.

The design system 200 is configured to abstract interfaces between instruction processors and user logic in circuit models. In one embodiment, the interfaces are realized through shared memories in the circuit model. For example, through the HLMS capture module 206 and/or HDL capture module 207, a circuit designer specifies a model having a processor block and various custom logic blocks ("logic blocks"). The processor block is an abstraction of an instruction processor provided as part of the circuit descriptions 208 and/or HDL descriptions 210.

In one embodiment, the processor block represents a processor embedded within an IC, such as an FPGA. Alternatively, the processor block may represent a host processor to which an FPGA, for example, is connected. The processor block may represent a soft processor, such as the MICROBLAZE processor available from Xilinx, Inc. Alternatively, the processor block may represent a hard processor, such as an x86 processor available from Intel Corporation or a POWER PC processor available from IBM Corporation. Connections to the processor may be direct point-to-point connections, such as a bus (e.g., a peripheral component interconnect (PCI) bus). Connections may also be indirect, such as via the Internet carried by protocols such as transmission control protocol/internet protocol (TCP/IP).

In order to interface the user logic with the processor block, the circuit designer specifies one or more shared memory blocks. A shared memory block is an abstraction provided as part of the circuit descriptions 208 and/or HDL descriptions 210. For example, shared memory blocks may represent different types of shared memories, such as shared random access memories (RAMs), shared first-in-first-out (FIFO) memories, shared register memories, and the like. For purposes of clarity by example, the invention is described below with respect to a circuit model having a single processor block. Those skilled in the art will appreciate that the invention may be employed with a circuit model having one or more processor blocks. That is, the circuit model may include multiple processors and multiple shared memory blocks. One or more of the processors may be associated with one or more of the processors.

The circuit designer employs shared memory blocks in locations where software access is required. For example, the status of hardware in the user logic may be stored in a register. To make the status information visible to the processor, the register is implemented in the model as a shared register. Once the desired shared memory block(s) are specified, the circuit designer associates the shared memory block(s) with the processor. In one embodiment, the circuit designer interacts with the HLMS capture module 206 and/or HDL capture module 207 to add the shared memory block(s) in the user logic to the memory map of the processor.

The automatic processor integration module 212 augments the circuit model with the interfacing logic required to connect the shared memory block(s) to the processor block. In one embodiment, the automatic processor integration module 212 creates a matching shared memory block for each shared memory block associated with the processor block (e.g., each shared memory block added to the memory map of the processor block). The automatic processor integration module 212 also creates a memory map block for accessing the matching shared memory block(s) and a bus adapter block for coupling the memory map block to the processor block. The bus adapter block will vary depending on the particular type of processor block employed in the circuit model. The circuit description library 208 and/or the HDL description library 210 may include various types of bus adapter blocks for various types of processors. For example, the bus adapter block may represent a fast simplex link (FSL) interface to a MICROBLAZE soft processor, an on-chip peripheral bus (OPB) interface to a POWER PC processor, or like type of processor interface known in the art.

Figure 3:
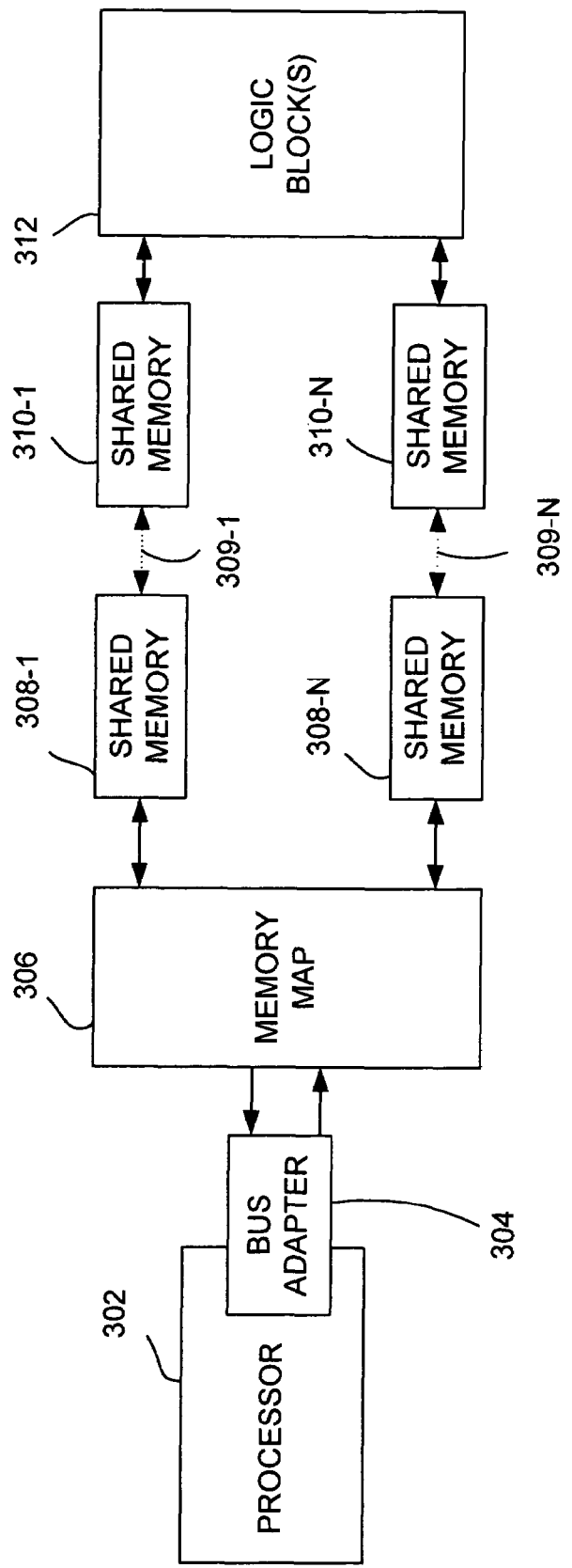
FIG. 3 is a block diagram depicting an exemplary embodiment of a circuit model in accordance with one or more aspects of the invention.

FIG. 3 is a block diagram depicting an exemplary embodiment of a circuit model 300 in accordance with one or more aspects of the invention. The circuit model 300 includes a processor 302, a bus adapter 304, a memory map 306, shared memories 308-1 through 308-N (shared memories 308), shared memories 310-1 through 310-N (shared memories 310), and logic blocks 312, where N is an integer greater than zero. The logic blocks 312 may include various types of logic blocks specified by the circuit designer (e.g., logic gates, delay elements, multiplexers, etc.). The shared memories 310 are coupled to the logic blocks 312 and provide an interface to the processor 302. The logic blocks 312, the shared memories 310, and the processor 302 comprise the user design.

The shared memories 308 are automatically generated by the automatic processor integration module 212. The shared memories 308 are associated with the shared memories 310 via virtual links 309-1 through 309-N (virtual links 309). When a hardware representation of the circuit model 300 is generated, each shared memory pair is implemented with a single physical memory. The shared memories 308 are coupled to the memory map 306. The memory map 306 provides access to the memory space provided by the shared memories 308. The memory map 306 includes a well-defined interface and is coupled to the bus adapter 304. The bus adapter 304 is configured to interface with the bus of the processor 302. The shared memories 308, the memory map 306, and the bus adapter 304 comprise the interface automatically generated by the automatic processor integration module 212.

Returning to FIG. 2, in one embodiment, the bus adapter, memory map, and matching shared memories (i.e., the shared memories 308) are implicit descriptions in the circuit model (i.e., the automatically generated interface is completely abstracted from the circuit design). That is, the bus adapter, memory map, and matching shared memories may be implicit blocks in an HLMS description of the circuit model, or implicit HDL descriptions in an HDL description of the circuit model. In another embodiment, at least one of the memory map or the bus adapter is/are provided as explicit descriptions in the circuit model. This provides circuit designers with additional control over bus interfacing at the cost of increased complexity.

Figure 5:
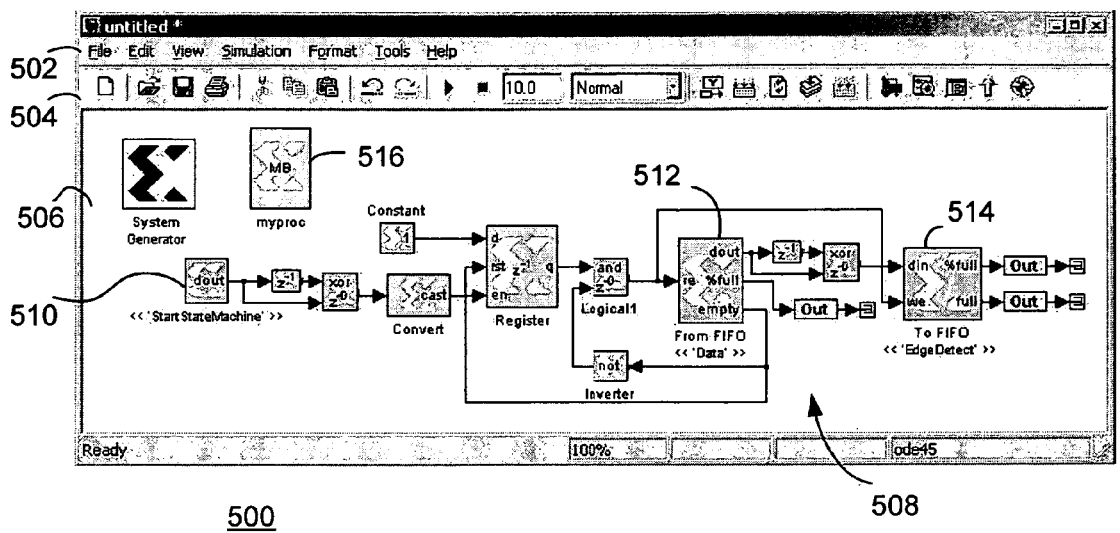
FIG. 5 illustrates an exemplary GUI implemented by the modeling system of FIG. 2 in accordance with one or more aspects of the invention.

FIG. 5 illustrates an exemplary GUI 500 implemented by the HLMS capture module 206 in accordance with one or more aspects of the invention. The GUI 500 illustratively includes a menu bar 502, a tool bar 504, and a design view 506. An exemplary circuit model 508 is shown in the design view 506 that include various blocks, ports, and nets. In particular, the circuit model 508 includes a shared register 510, a shared FIFO 512, and a shared FIFO 514. The shared register 510 is named "StartStateMachine"; the shared FIFO 512 is named "Data"; and the shared FIFO 512 is named "EdgeDetect". The circuit model 508 further includes a processor block 516. The circuit model 508 is merely one of a myriad of possible designs that may be specified using the GUI 500 and the HLMS capture module 206.

In one embodiment, the shared register 510 and the shared FIFOs 512 and 514 can be associated with the processor block 516 by opening a parameterization GUI for the processor block 516. For example, the parameterization GUI may be accessed using the menu bar 502, the tool bar 504, or by "double-clicking" on the processor block 516.

Figure 6:
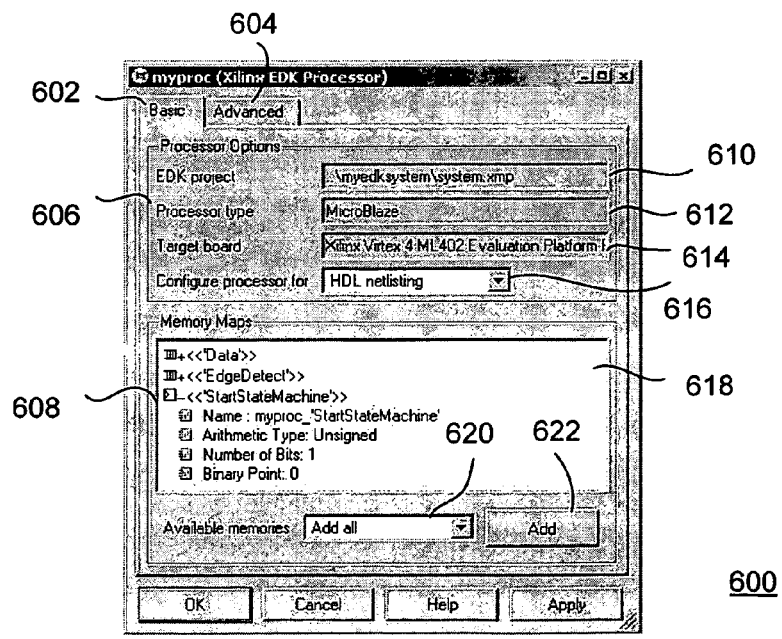
FIG. 6 illustrates an exemplary parameterization GUI in accordance with one or more aspects of the invention.

FIG. 6 illustrates an exemplary parameterization GUI 600 in accordance with one or more aspects of the invention. The parameterization GUI 600 illustratively includes a basic tab 602 and an advanced tab 604. The basic tab 602 includes a processor options control group 606 and a memory maps control group 608. The processor options control group 606 includes edit boxes 610 through 616. The edit box 610 includes the name of an embedded design kit (EDK) project.

The edit box 612 includes the name of the processor represented by the processor block 516. The edit box 614 includes the name of the target board for the project. The edit box 616 includes a mode for the processor block 516. The edit boxes 610 through 616 are merely exemplary. Those skilled in the art will appreciate that the GUI 600 may include other types of processor option controls.

The memory maps control group 608 includes an edit box 618, a drop-down box 620, and a button 622. The edit box 618 is configured to show the names and attributes of shared memories associated with the processor block 516. In the present example, the processor block 516 is associated with the shared register 510 (StartStateMachine), the shared FIFO 512 (Data), and the shared FIFO 514 (EdgeDetect). The drop-down box 620 is used to select specific shared memories in the circuit model 508. The button 622 is used to add the shared memories selected in the drop-down box 620 to the edit box 618. The GUI 600 is merely an exemplary parameterization GUI. Those skilled in the art will appreciate that other types of GUIs may be used to associate shared memories with the processor.

Although the GUIs 500 and 600 relate to the HLMS capture module 206, those skilled in the art will appreciate that similar GUIs may be provided as part of schematic capture in the HDL capture module 207. That is, the HDL capture module 207 may provide a schematic view of circuit components similar to that shown in FIG. 5. Shared memories in the schematic view can be associated with a processor block by opening a parameterization GUI for the processor block, similar to that shown in FIG. 6.

Returning to FIG. 2, in one embodiment, the automatic processor integration module 212 is further configured to automatically generate software drivers for accessing the shared memories from a software program executing on the processor. In one embodiment, the generated software drivers comprise source code file(s) and header file(s) that reference various functions for accessing the shared memories. During software driver generation, names of shared memory blocks in the circuit model are assigned locations in the memory map. For example, a shared memory block named "data" may be assigned bank 0, location 0 of the memory map. The software drivers are configured such that the shared memory names are related to locations in the memory map. In one embodiment, pre-processor statements, such as C-code #define statements, are used to relate shared memory names to corresponding locations (e.g., bank, location) in the memory map. In this manner, software engineers need only refer to shared memory names (e.g., "data") instead of having to know the bank and memory location of the shared memory in the memory map.

For example, the following low-level functions (written in C) may be defined to access the shared memories:

int Read (unsigned int memName, unsigned int addr, unsigned int* val);

int ArrayRead (unsigned int memName, unsigned in startAddr, unsigned int transferLength, unsigned int** valBuf);

int Write (unsigned int memName, unsigned int addr, unsigned int val);

int ArrayWrite (unsigned int memName, unsigned int startAddr, unsigned int transferLength, const unsigned int* valBuf);

unsigned int GetFifoDataCount (unsigned int memName);

unsigned int GetFifoEmptyCount (unsigned int memName);

In the above example, the Read function is configured to read a value from a shared memory designated by the memName parameter. The ArrayRead function is configured to read an array of values from a shared memory designated by the memName parameter. The Write function is configured to write a value to a shared memory designated by the memName parameter. The ArrayWrite function is configured to write an array of values to a shared memory designated by the memName parameter. The GetFifoDataCount function is configured to return the number of data values stored in a shared FIFO designated by the memName parameter. The GetFifoEmptyCount function is configured to return the number of unused locations in a shared FIFO designated by the memName parameter. Those skilled in the art will appreciate that various other types of functions may be specified for accessing the shared memories. In addition, the functions in the software drivers may be specified using other types of programming languages.

In the example above, a memory name is used to identify a shared memory. A software engineer may write the following code that uses the functions above to read from a shared register named "EdgeDetect" into a variable "val":

unsigned int val;

unsigned int status;

status = Read(EDGEDETECT, EDGEDETECT_DOUT, &val);

In one embodiment, the automatic processor integration module 212 is further configured to automatically generate software documentation. The software documentation may include, for example, software driver header file information, driver functions, memory map information, example software code utilizing the drivers, and the like.

Figure 4:
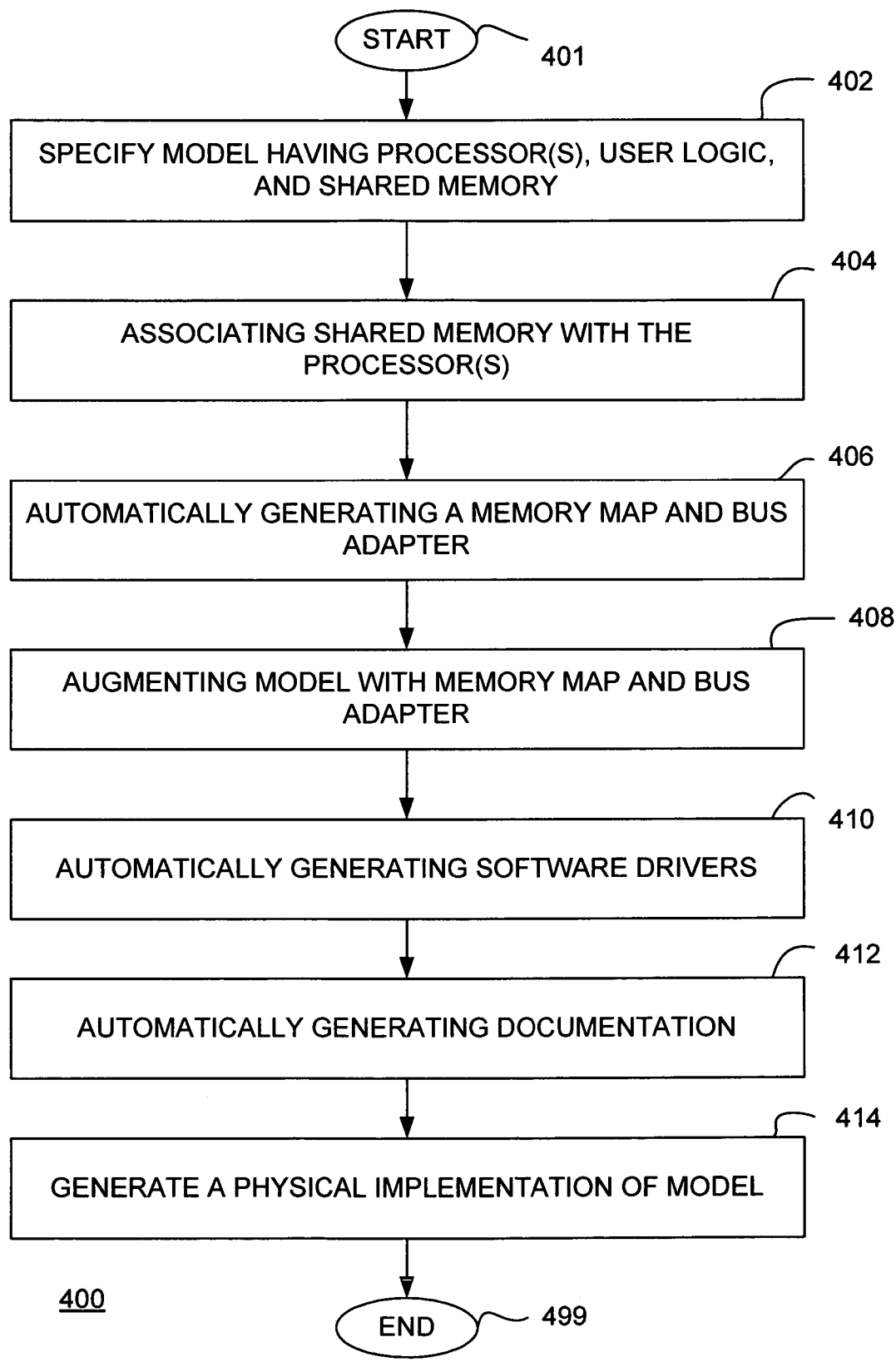
FIG. 4 is a flow diagram depicting an exemplary embodiment of a method of circuit design in accordance with one or more aspects of the invention.

FIG. 4 is a flow diagram depicting an exemplary embodiment of a method 400 of circuit design in accordance with one or more aspects of the invention. The method 400 begins at step 401. At step 402, a circuit model having at least one processor, user logic, and shared memory block(s) is specified. At step 404, the shared memory block(s) is/are associated with the processor(s). At step 406, a memory map and a bus adapter are automatically generated. At step 408, the circuit model is augmented with the memory map and the bus adapter. In one embodiment, the memory map and the bus adapter are implicitly defined in the circuit model. Alternatively, the memory map and the bus adapter may be explicitly defined in the circuit model. At step 410, software drivers are automatically generated. At step 412, software documentation is automatically generated. At step 414, physical implementation of the circuit model is generated. The method 400 ends at step 499.

Method and apparatus for circuit design has been described. An embodiment of the invention provides a bus independent design methodology for coupling user logic to instruction processors in an HLMS and/or HDL design environment. Circuit designers may design peripherals (user logic) that communicate through shared memories. The circuit designers associate shared memory blocks to a processor using graphical controls (e.g., a parameterization GUI). The design system automatically generates a "memory-to-bus interface," selecting a relevant bus adapter based on the system-level design. The design system automatically generates software drivers and software documentation, allowing users to access the shared memories in software, by name.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of circuit design, comprising:
specifying a model having at least one processor, at least one logic block, and at least one shared memory, the at least one shared memory providing an interface between the at least one processor and the at least one logic block;
associating at least one shared memory with the at least one processor; and
automatically generating a memory-map associated with the at least one shared memory and a bus adapter for coupling the memory-map to the at least one processor.

2. The method of claim 1, further comprising:
generating a hardware description language representation of the model having hardware descriptions for the at least one processor, the at least one logic block, the memory-map, the bus adapter, and the at least one shared memory.

3. The method of claim 1, wherein the memory-map and the bus adapter are implicit descriptions in the model.

4. The method of claim 1, wherein at least one of the memory map or the bus adapter is an explicit description in the model.

5. The method of claim 1, further comprising:
automatically generating software drivers in response to the memory-map.

6. The method of claim 5, wherein the step of automatically generating software drivers comprises:
assigning each of the at least one shared memory to a location in the memory-map; and
relating each of the at least one shared memory and a respective location in the memory-map using an identifier.

7. The method of claim 5, further comprising:
automatically generating software documentation in response to the software drivers.

8. Apparatus for circuit design, comprising:
means for specifying a model having at least one processor, at least one logic block, and at least one shared memory and associating at least one shared memory with the at least one processor, the at least one shared memory providing an interface between the at least one logic block and the at least one processor; and
means for automatically generating a memory-map associated with the at least one shared memory and a bus adapter for coupling the memory-map to the at least one processor.

9. The apparatus of claim 8, wherein the means for specifying comprises at least one of a high level modeling system (HLMS) capture module or a hardware description language (HDL) capture module.

10. The apparatus of claim 8, further comprising:
means for generating an HDL representation of the model having hardware descriptions for the at least one processor, the at least one logic block, the memory-map, the bus adapter, and the at least one shared memory.

11. The apparatus of claim 8, wherein the memory-map and the bus adapter are implicit descriptions in the model.

12. The apparatus of claim 8, wherein at least one of the memory map or the bus adapter is an explicit description in the model.

13. The apparatus of claim 8, wherein the means for automatically generating is further configured to automatically generate software drivers in response to the memory-map.

14. The apparatus of claim 13, wherein the means for automatically generating is configured to:
assign each of the at least one shared memory to a location in the memory-map; and
relate each of the at least one shared memory and a respective location in the memory-map using an identifier.

15. The apparatus of claim 13, wherein the means for automatically generating is configured to automatically generate software documentation in response to the software drivers.

16. A computer readable medium having instructions stored thereon that when executed by a processor cause the processor to perform a method of circuit design, the method comprising:
specifying a model having at least one processor, at least one logic block, and at least one shared memory, the at least one shared memory providing an interface between the at least one logic block and the at least one processor;
associating at least one shared memory with the at least one processor; and
automatically generating a memory-map associated with the at least one shared memory and a bus adapter for coupling the memory-map to the at least one processor.

17. The computer readable medium of claim 16, wherein the method further comprises:
generating a hardware description language representation of the model having hardware descriptions for the at least one processor, the at least one logic block, the memory-map, the bus adapter, and the at least one shared memory.

18. The computer readable medium of claim 16, wherein the memory-map and the bus adapter are implicit descriptions in the model.

19. The computer readable medium of claim 16, wherein at least one of the memory map or the bus adapter is an explicit description in the model.

20. The computer readable medium of claim 16, wherein the method further comprises:
automatically generating software drivers in response to the memory-map; and
automatically generating software documentation in response to the software drivers.

* * * * *